United States Patent
Suwald

(10) Patent No.: US 10,386,398 B2
(45) Date of Patent: Aug. 20, 2019

(54) ELECTRONIC DEVICE

(71) Applicant: NXP B.V., Eindhoven (NL)

(72) Inventor: Thomas Suwald, Hamburg (DE)

(73) Assignee: NXP B.V., Eindhoven (NL)

( * ) Notice: Subject to any disclaimer, the term of this patent is extended or adjusted under 35 U.S.C. 154(b) by 313 days.

(21) Appl. No.: 15/289,169

(22) Filed: Oct. 8, 2016

(65) Prior Publication Data

US 2017/0102419 A1    Apr. 13, 2017

(30) Foreign Application Priority Data

Oct. 12, 2015   (EP) .................................... 15189388

(51) Int. Cl.
*G01R 27/26*    (2006.01)
*H01L 23/498*   (2006.01)
(Continued)

(52) U.S. Cl.
CPC ..... *G01R 27/2605* (2013.01); *G06K 9/00577* (2013.01); *G06K 9/46* (2013.01); *G06K 19/073* (2013.01); *H01L 23/49855* (2013.01); *H01L 23/573* (2013.01); *H01L 23/642* (2013.01); *H01L 24/27* (2013.01); *H01L 24/31* (2013.01); *H05K 1/0275* (2013.01); *H05K 1/0296* (2013.01); *H05K 1/092* (2013.01); *H05K 1/181* (2013.01); *H05K 3/305* (2013.01); *H01L 24/16* (2013.01); *H01L 24/32* (2013.01); *H01L 24/83* (2013.01); *H01L 2224/16227* (2013.01); *H01L 2224/2929* (2013.01); *H01L 2224/29339* (2013.01); *H01L 2224/29344* (2013.01); *H01L 2224/29499* (2013.01);
(Continued)

(58) Field of Classification Search
CPC ..... G01R 27/2605; G06K 19/073; G06K 9/00
USPC ......................................................... 324/679
See application file for complete search history.

(56) References Cited

U.S. PATENT DOCUMENTS 5,881,155 A   3/1999  Rigal
6,588,672 B1  7/2003  Usami
(Continued)

FOREIGN PATENT DOCUMENTS

EP  1 818 860 A2       8/2007
WO  WO 02/054492 A2    7/2002
WO  WO 2011/141422 A1  11/2011

OTHER PUBLICATIONS

Extended European Search Report for Patent Appln. No. 15189388.0 (dated Apr. 22, 2016).

*Primary Examiner* — Amy He

(57) ABSTRACT

According to a first aspect of the present disclosure, an electronic device is provided which comprises: a substrate; an integrated circuit; a layer of conductive glue between the substrate and the integrated circuit; at least one first electrode connected to the conductive glue and at least one second electrode connected to the conductive glue; wherein the first electrode and the second electrode are arranged to receive a voltage generator input, such that a capacitance develops between said first electrode and second electrode, wherein at least a part of said capacitance develops through the layer of conductive glue; and wherein the first electrode and the second electrode are arranged to output said capacitance. According to a second aspect of the present disclosure, a corresponding method of manufacturing an electronic device is conceived.

14 Claims, 6 Drawing Sheets

(51) Int. Cl.
*G06K 9/00* (2006.01)
*G06K 19/073* (2006.01)
*H01L 23/00* (2006.01)
*H05K 1/02* (2006.01)
*H05K 1/09* (2006.01)
*H05K 1/18* (2006.01)
*H05K 3/30* (2006.01)
*H01L 23/64* (2006.01)
*G06K 9/46* (2006.01)

(52) U.S. Cl.
CPC ............... *H01L 2224/32225* (2013.01); *H01L 2224/73204* (2013.01); *H01L 2224/83862* (2013.01); *H01L 2224/83874* (2013.01); *H01L 2924/01029* (2013.01); *H01L 2924/14* (2013.01)

(56) References Cited

U.S. PATENT DOCUMENTS

| | | |
|---|---|---|
| 6,766,040 B1 * | 7/2004 | Catalano ............ G06K 9/00067 340/5.53 |
| 8,516,269 B1 | 8/2013 | Hamlet et al. |
| 9,317,164 B2 | 4/2016 | Suwald |
| 2003/0209362 A1 * | 11/2003 | Kasuga ............ G06K 19/0718 174/260 |
| 2008/0108181 A1 | 5/2008 | Chan et al. |
| 2009/0179751 A1 * | 7/2009 | Forster ............... G06K 19/0717 340/501 |
| 2010/0090714 A1 | 4/2010 | Van Geloven et al. |
| 2010/0127822 A1 | 5/2010 | Devadas |
| 2012/0002803 A1 | 1/2012 | Adi et al. |
| 2016/0003895 A1 * | 1/2016 | Farr ................... G01R 31/2884 324/754.03 |

* cited by examiner

ELECTRONIC DEVICE

CROSS-REFERENCE TO RELATED APPLICATIONS

This application claims the priority under 35 U.S.C. § 119 of European patent application no. 15189388.0, filed on Oct. 12, 2015, the contents of which are incorporated by reference herein.

FIELD

The present disclosure relates to an electronic device. Furthermore, the present disclosure relates to a corresponding method of manufacturing an electronic device.

BACKGROUND

Today, electronic devices such as smart cards are widely used in society. For example, smart cards may be used as electronic identity (eID) cards. The end-user acceptance of such eID cards, however, is still relatively low. Although the eID cards are relatively secure, due to their cryptographic capabilities which are offered by embedded secure elements (e.g., secure controller chips), it is difficult to verify whether a particular combination of a secure element and a device body (e.g., a substrate) on which said secure element is mounted is authentic. In general, it is difficult to verify whether a particular combination of integrated circuit (e.g., a processing unit) and a device body (e.g., a substrate) on which said integrated circuit is mounted is authentic. Consequently, electronic devices of the kind set forth are still susceptible to tampering.

SUMMARY

According to a first aspect of the present disclosure, an electronic device is provided which comprises: a substrate; an integrated circuit; a layer of conductive glue between the substrate and the integrated circuit; at least one first electrode connected to the conductive glue and at least one second electrode connected to the conductive glue; wherein the first electrode and the second electrode are arranged to receive a voltage generator input, such that a capacitance develops between said first electrode and second electrode, wherein at least a part of said capacitance develops through the layer of conductive glue; and wherein the first electrode and the second electrode are arranged to output said capacitance.

In one or more embodiments, the capacitance depends on the distribution of conductive particles in the layer of conductive glue.

In one or more embodiments, the distribution of conductive particles implements a physical unclonable function.

In one or more embodiments, the device further comprises: a voltage generator being arranged to generate the voltage generator input, a measurement unit being arranged to measure said capacitance and to output a corresponding capacitance value; a processing unit which is arranged to receive at least one capacitance value from the measurement unit, and to compare said capacitance value with a reference value.

In one or more embodiments, the processing unit is further arranged to correct the capacitance value for environmental influences.

In one or more embodiments, the integrated circuit comprises at least one of: the processing unit, the first electrode, the second electrode, the voltage generator, the measurement unit.

In one or more embodiments, the device further comprises a plurality of pairs of first electrodes and second electrodes connected to the conductive glue; wherein each pair of first electrodes and second electrodes is arranged to receive the voltage generator input, such that a capacitance develops between each pair, wherein at least a part of said capacitance develops through the layer of conductive glue; and wherein each pair is arranged to output said capacitance.

In one or more embodiments, the voltage generator input of each pair is generated under control of a set of control signals.

In one or more embodiments, the set of control signals represents a challenge code generated by a processing unit comprised in said device.

In one or more embodiments, the processing unit is further arranged to compare a plurality of measured capacitance values with a predetermined response code.

In one or more embodiments, the integrated circuit is a general-purpose processor chip or an application processor chip.

In one or more embodiments, the substrate is a printed circuit board.

In one or more embodiments, the integrated circuit is a secure element, in particular a secure controller chip.

In one or more embodiments, the device is a smart card.

According to a second aspect of the present disclosure, a method of manufacturing an electronic device is conceived, the method comprising providing the electronic device with: a substrate; an integrated circuit; a layer of conductive glue between the substrate and the integrated circuit; at least one first electrode connected to the conductive glue and at least one second electrode connected to the conductive glue; wherein the first electrode and the second electrode are arranged to receive a voltage generator input, such that a capacitance develops between said first electrode and second electrode, wherein at least a part of said capacitance develops through the layer of conductive glue; and wherein the first electrode and the second electrode are arranged to output said capacitance.

DESCRIPTION OF DRAWINGS

Embodiments will be described in more detail with reference to the appended drawings, in which.

DESCRIPTION OF EMBODIMENTS

Figure 1:
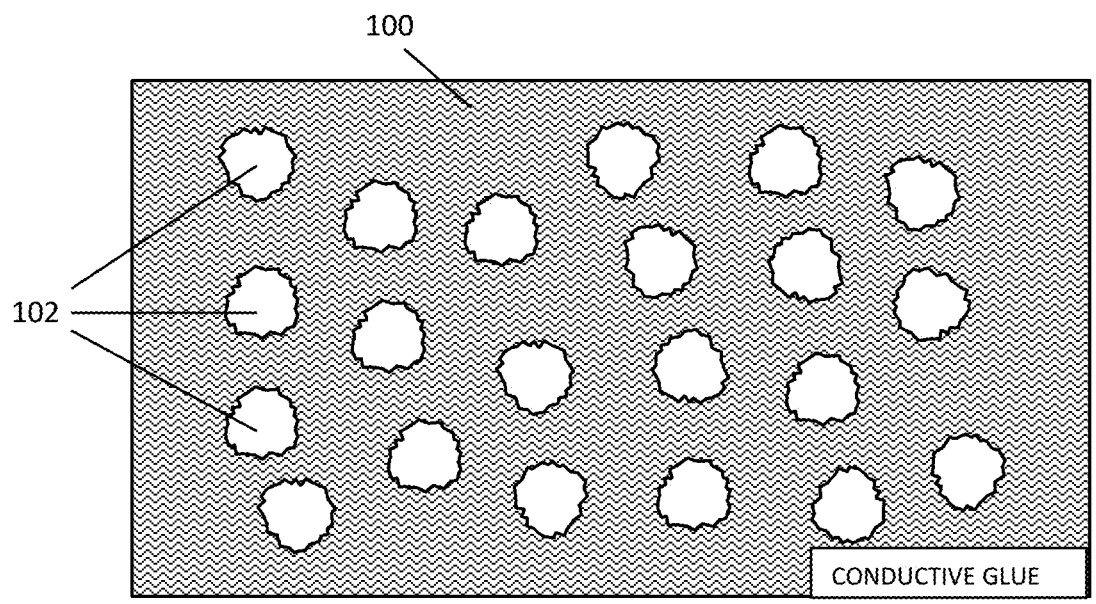
FIG. 1 shows an example of conductive glue.

As mentioned above, according to a first aspect of the present disclosure, an electronic device is provided which comprises: a substrate; an integrated circuit; a layer of conductive glue between the substrate and the integrated circuit; at least one first electrode connected to the conductive glue and at least one second electrode connected to the conductive glue; wherein the first electrode and the second electrode are arranged to receive a voltage generator input, such that a capacitance develops between said first electrode and second electrode, wherein at least a part of said capacitance develops through the layer of conductive glue; and wherein the first electrode and the second electrode are arranged to output said capacitance. Integrated circuits (ICs), such as security controller chips, are often assembled into card bodies of high-security electronic documents. The authenticity of the card body and the authenticity of the security controller chip may be verified separately, but it is difficult to verify that an authentic security controller chip has been assembled in an authentic way into an authentic card body. In other words, it is difficult to verify that a particular combination (i.e., a particular assembly) of an integrated circuit and a card body (i.e., a substrate on which the integrated circuit is mounted) is authentic. According to the present disclosure, the authenticity of the assembly may be verified with relatively few resources and at relatively low cost. This is achieved by utilizing physical properties of the conductive glue which is used to attach the integrated circuit to the substrate. In particular, it may be expected that the electric field and the resulting capacitance which develop between the first electrode and the second electrode, will differ between different assemblies, because the physical properties of the conductive glue will be different for each assembly. Thus, by measuring this capacitance, it may be possible to uniquely identify a particular assembly.

In one or more embodiments, the capacitance may depend on the distribution of conductive particles in the layer of conductive glue. Since the distribution of the conductive particles may vary significantly among different assemblies, the probability that the assembly identification is unique may thus be increased. Furthermore, the distribution of conductive particles may depend on inherent variabilities in the manufacturing process, which may enable a quasi-random distribution of conductive particles. Thus, the distribution of conductive particles may implement a physical unclonable function (PUF), which may further increase the probability that the assembly identification is unique. In other words, by utilizing a quasi-random distribution of conductive particles in the conductive glue, a unique signature may be derived that may be used for IC-substrate assembly identification (i.e., for verifying that the IC-substrate assembly is authentic).

The conductive glue may be anisotropic conductive glue. Anisotropic conductive glue is a material used to assemble naked dice onto substrates such as card inlays or printed circuit boards (PCBs). The integrated circuit may be a secure element, such as a secure controller chip, in a smart card. In that case, the substrate may be the card inlay on which the secure controller chip is assembled. Alternatively, but without limitation, the integrated circuit may be a general-purpose processor chip or application processor chip. In that case, the substrate may be the PCB on which the processor chip is assembled, for example in a mobile device, and the IC-substrate assembly identification may be used to implement counterfeiting protection.

FIG. 1 shows an example of conductive glue 100. The conductive glue 100 comprises conductive particles 102 dispersed in a resin. The glue 100 may be used to assemble naked dice onto substrates, such as printed circuit boards or card inlays. The conductive particles 102 may be flakes made from metals comprising silver or gold. The flakes may have an irregular size and shape and may be quasi-randomly distributed in the conductive glue 100 due to inherent variabilities in the manufacturing process. Other physical effects, such as surface tension, may also influence the particle distribution. The median diameter of said flakes may be related to the diameter of contact pads to which the glue 100 is attached; as a rule of thumb the flake diameter may be selected to be at least ⅕ of the smaller of width or length of the contact pads. In practical implementations the diameters range from 10 µm to 30 µm. By applying pressure in a vertical direction during chip assembly the particles 102 contained in the glue 100 are condensed until electrical contact is established between the contact pads. The resin is displaced to the sides. Heat or UV-light applied during assembly starts the curing process of the resin. When cured the glue 100 provides strong adhesion between the chip and the substrate.

Figure 2:
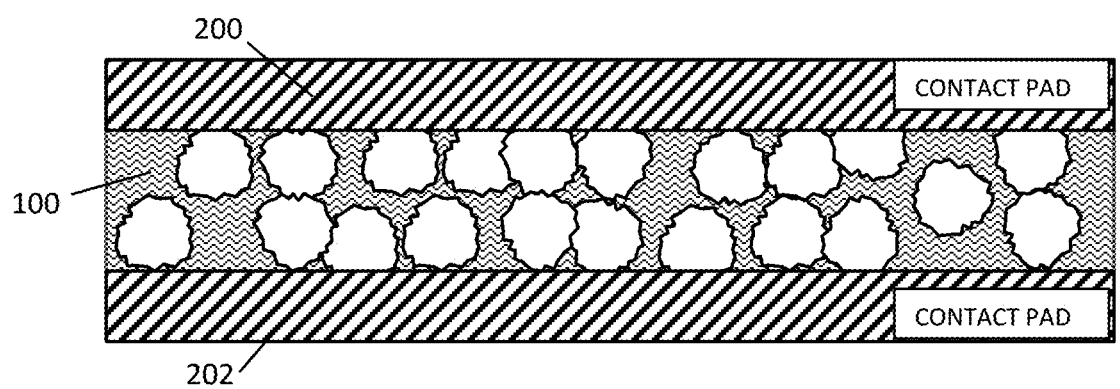
FIG. 2 shows an example of an assembly comprising conductive glue.

FIG. 2 shows an example of an assembly comprising conductive glue 100. The assembly comprises a first contact pad 200, for example of a chip (not shown), and a second contact pad 202, for example of a substrate (not shown). As can be seen, at some locations in the glue 100 there are series of conductive particles touching each other and the contact pads 200, 202, so as to create a conductive path between said contact pads 200, 202.

Figure 3:
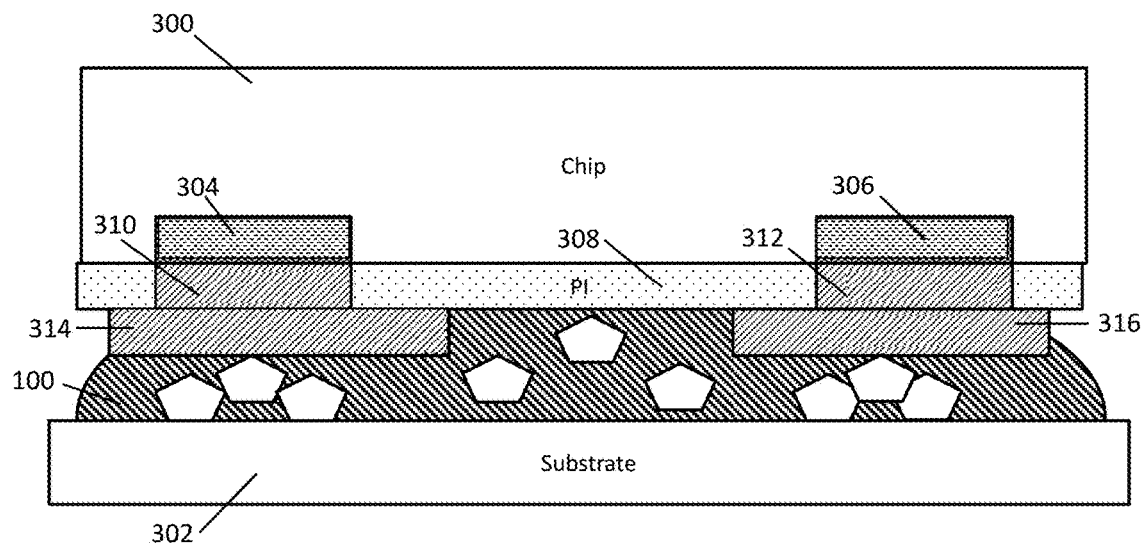
FIG. 3 shows an example of a chip assembled on a substrate using a conductive glue.

FIG. 3 shows an example of a chip 300 assembled on a substrate 302 using a conductive glue 100. The chip 300 has contact pads 304, 306 which are connected to the conductive glue 100 via, an under-bump metallization (UBM) 310, 312 and a redistribution layer (RDL) 314, 316. The UBMs 310, 312 are embedded in an insulation layer 308 that may be made from polyimide. The UBMs 310, 312 create contact between the contact pads 304, 306 and the RDL metallization 314, 316, Which may be made from copper.

Figure 4:
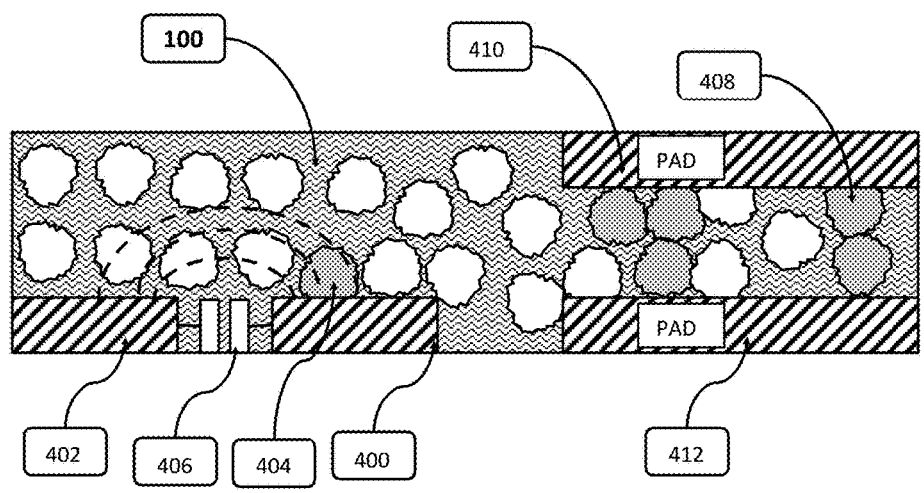
FIG. 4 shows an illustrative embodiment of an electronic device.

FIG. 4 shows an illustrative embodiment of an electronic device. The electronic device comprises a first electrode 400 and a second electrode 402. The first electrode 400 may function as a receiving electrode and the second electrode 402 may function as a driving electrode, for example. Alternatively, the first electrode 400 may function as a driving electrode and the second electrode 402 may function as a receiving electrode. The first electrode 400 and the second electrode 402 may be directly coupled to the chip (not shown) or form part thereof. The electronic device further comprises a contact pad 410 at the side of the substrate (not shown) and another contact pad 412 at the side of the chip, The first electrode 400 and the second electrode 402 may conveniently be connected to the conductive glue 100 at locations where there are no contact pads, as shown in FIG. 4. It is noted that some particles, such as particle 404 408, may not be fully condensed and therefore do not provide electrical contact.

In accordance with the present disclosure, a voltage is applied between the first electrode 400 and the second electrode 402 and consequently an electric field develops. The electric field may comprise a direct electric field between the electrodes 400 and 402, which is represented by a capacitor 406. In addition, a major part of the electric field between said electrodes 400, 402 develops as the so-called stray field indicated by the circular dashed lines reaching from one of the two electrodes 400, 402 to the other. The conductive particles which are present within the stray field modify the electric field, which directly impacts the capacitance that can be measured between the two electrodes 400, 402. Some conductive particles, such as particle 404, may get in contact with one of the two electrodes 400, 402, which further modifies the electric stray field and hence the resulting capacitance. Thus, a certain distribution of conductive particles contained in the conductive glue 100 may result in a corresponding capacitance that can be measured between the two electrodes 400, 402. Furthermore, since the distribution of conductive particles may vary significantly among different IC-substrate assemblies, the measured capacitance may be regarded as a unique identifier or unique signature of such an assembly.

Figure 5:
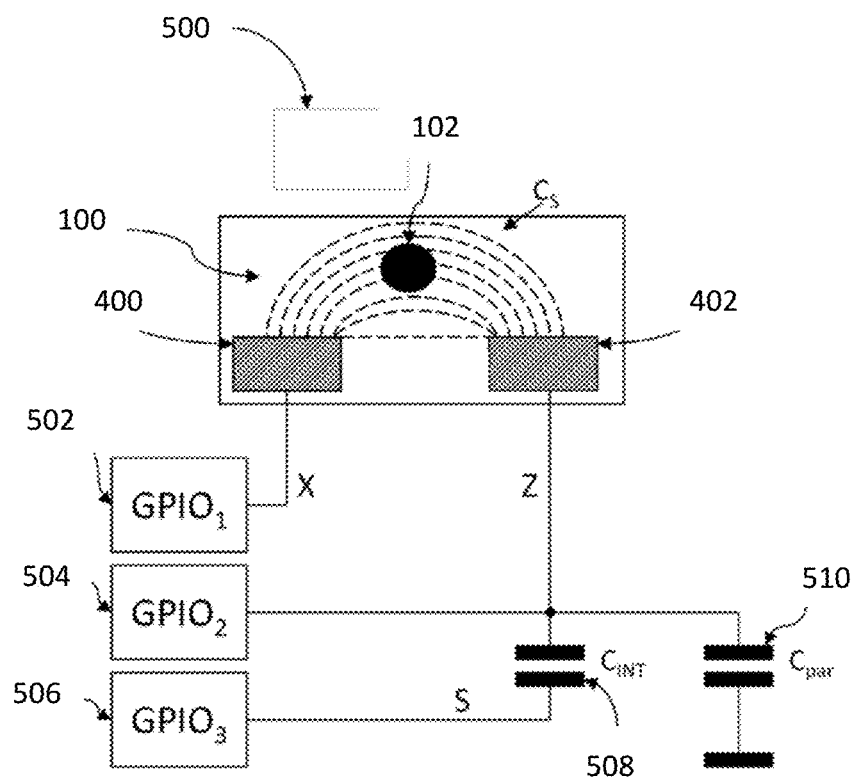
FIG. 5 shows an illustrative embodiment of a measurement unit.

FIG. 5 shows an illustrative embodiment of a measurement unit In this example, a pair of electrodes 400, 402 has been embedded into the conductive glue 100. The electric stray field, which develops between the first electrode 400 and the second electrode 402, results in a capacitance $C_s$. As mentioned above, the presence of conductive particles, for example particle 102, in the electric stray field modifies said field, which directly impacts the capacitance $C_s$. The generation of the field and the measurement of the capacitance C, may be facilitated by components such as general-purpose input/output pins 502, 504, 506, an integration capacitor 508, and a parasitic capacitor 510. The skilled person will appreciate that this measurement unit is only an example, and that other types of measurement units may also be used to measure the capacitance $C_s$ which develops between the two electrodes 400, 402.

Figure 6:
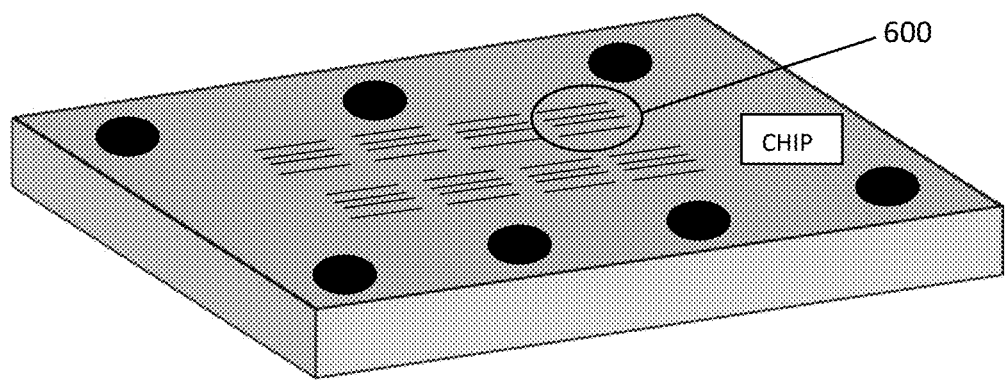
FIG. 6 shows an illustrative embodiment of a chip with a plurality of capacitive sensors.

FIG. 6 shows an illustrative embodiment of a chip with a plurality of capacitive sensors. The capacitive sensors may comprise electrode pairs which are arranged on the active surface of the chip. The active surface of the chip is the side of the chip that may comprise integrated components and contact pads (the latter being shown as black dots in FIG. 6). The active surface of the chip is the side that may be connected to the conductive glue. The electrodes of each pair may be interdigitated (not shown). Each pair of interdigitated electrodes may be referred as a capacitive sensor 600, because the pair of electrodes is used both to generate an electric stray field and to measure, or sense, the resulting capacitance. In this example, there are eight capacitive sensors organized in two rows and four columns. Arranging the two electrodes in an interdigitated pattern may provide a high capacitance density per area. Existing process modules for forming so-called redistribution layers may be used for creating and arranging the interdigitated patterns on the active side of the chip.

Figure 7:
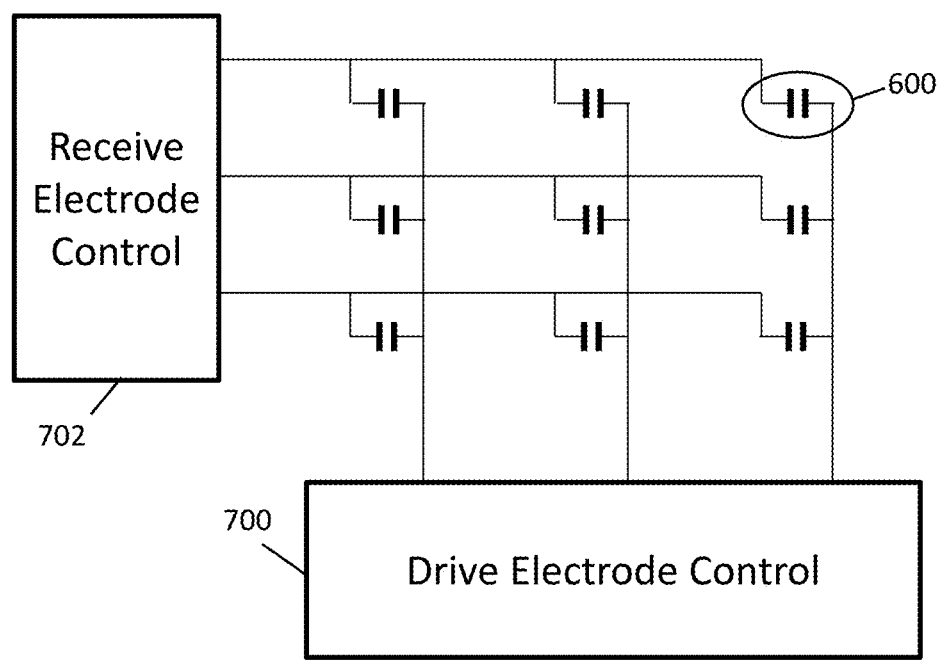
FIG. 7 shows an illustrative embodiment of a system for implementing a challenge/response scheme.

FIG. 7 shows an illustrative embodiment of a system for implementing a challenge/response scheme. A plurality of capacitive sensors 600 may be arranged on the surface of an integrated circuit, or chip, as shown in FIG. 6. The capacitive sensors may be arranged in rows and columns. All first electrodes of the capacitive sensors in one row may be connected to a common row signal that is furthermore connected to the input terminal of a receive electrode control circuit 702. All second electrodes of the capacitive sensors in one column may be connected to a common column signal that is furthermore connected to the output terminal of a drive electrode control circuit 700. The outputs of the drive electrode control circuit 700 may either be arranged to drive the connected electrodes or to be in inactive (high impedance) state. Logical control signals may be used to select one of the two states. A combination of such logical control signals may be used to control all outputs of said drive electrode control circuit 700. Said combination of logical control signals thus represents a first challenge code. The inputs of the receive electrode control circuit 702 may either be arranged to sense the capacitance or to be in inactive (high impedance state). Logical control signals may be used to select one of the two states. A combination of such logical control signals may be used to control all outputs of said receive electrode control circuit 702, Said combination of logical control signals thus represents a second challenge code. After having applied a first and a second challenge code the combined capacitance of the actively connected capacitive sensors may be evaluated. The measured capacitance represents a response to the two challenge codes. By sequentially performing said capacitance measurements, each being based on a different set of challenge codes, a corresponding set of responses may be captured. The resulting capacitance readings over challenges represent the response pattern.

Thus, in one or more embodiments, the device comprises a plurality of pairs of first electrodes and second electrodes connected to the conductive glue. In that case, the voltage generator may be arranged to generate a voltage between each pair of first electrodes and second electrodes, such that a capacitance develops between each pair, wherein at least a part of said capacitance develops through the layer of conductive glue. Furthermore, the measurement unit may be arranged to measure the capacitance between each pair. The voltage generator may further be arranged to generate said voltage between each pair under control of a set of control signals, and the set of control signals may represent a challenge code generated by a processing unit. Furthermore, the processing unit may be arranged to compare a plurality of measured capacitance values with a predetermined response code. In this way, since the identification of the IC-substrate assembly depends on a plurality of capacitance measurements, the identification may be more precise.

As mentioned above, it is also possible to evaluate the combined capacitance of actively connected capacitive sensors. The combined capacitance may then be compared with a reference value, i.e. an expected response. A sequence of readings of combined capacitances may represent a response pattern, in which case the whole sequence may be compared at once with an expected response pattern. The entropy of the responses is scalable by, for instance, adjusting the size of the capacitive sensors, the amount of capacitive sensors, the arrangement of the capacitive sensors in e.g. rows and columns on a chip, the entropy of the challenge codes, the amount of applied challenge codes, and the dimension of conductive particles in proportion to the dimension of the electrodes. Properly adjusting the various factors may result in high entropy.

Figure 8:
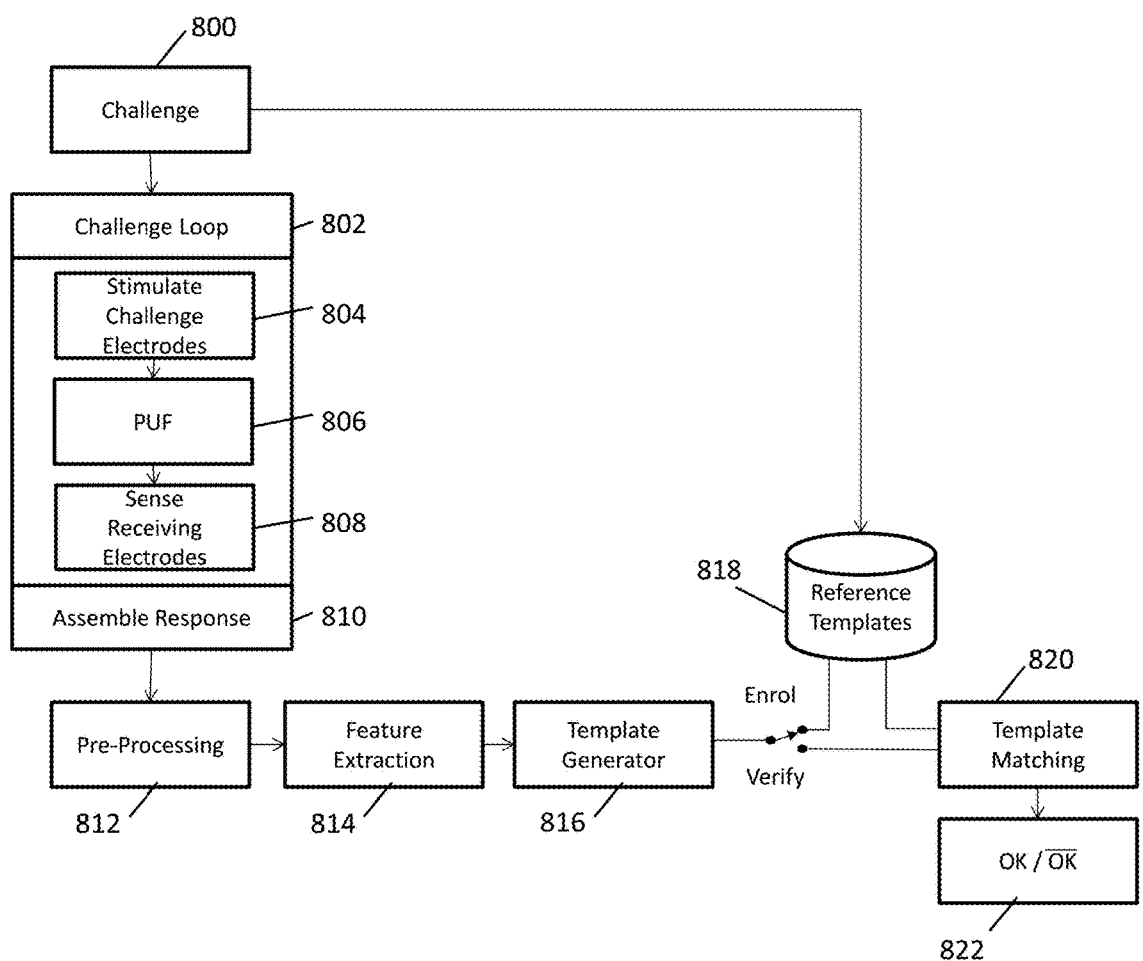
FIG. 8 shows an illustrative embodiment of a biometric system.

FIG. 8 shows an illustrative embodiment of a biometric system. This system may be referred to as a biometric system, because the derived identifier or signature of the IC-substrate assembly may be regarded as a physical fingerprint of said assembly. In a challenge loop 802 at least one challenge 800 is applied and the resulting response is obtained by means of one or more capacitance measurement readings of the kind set forth. In each iteration of the loop, a set of driving electrodes (or challenge electrodes) may be stimulated 804, and the capacitance influenced by the conductive particles (implementing a PUF 906) may be measured or sensed by receiving electrodes at 808. The response obtained may exhibit a variation based on, for example, environmental effects. To make the response applicable for further evaluation it may have to undergo a feature extraction process 814 that extracts a reliable set of identification features which are independent of said environmental impacts. The extracted feature may be a capacitance reading that by pre-processing 812 has been corrected for environmental impacts comprising, for instance, temperature, humidity and air pressure. Thereby, amore reliable identification of the IC-substrate assembly may be achieved. The extracted identification feature may be a set of capacitance measurements based on a series of challenge codes. Said extracted feature may be formatted by a template generator 816 as a template for easy and fast matching against a reference template in a template database 816. In a device manufacturing phase, a set of challenge-response pairs may be determined and stored as a set of reference templates in the database 816 within a secure storage unit of the chip, for example. This process is called enrolment. The stored challenge-response pairs may form a code alphabet. In a normal operating mode, challenges from the code alphabet are applied and the resulting responses are matched 820 against the reference templates. A threshold may be defined to set the number of positive verifications that should be obtained from a set of challenge/response pairs to achieve an overall positive verification result 822. It may be useful to update the physical fingerprint by defining a new set of challenge/response pairs. By principle the system as disclosed here is able to provide a large but not unlimited number of challenge/response pairs that may be regarded as the definition space for the code alphabet used by the biometric system.

Figure 9:
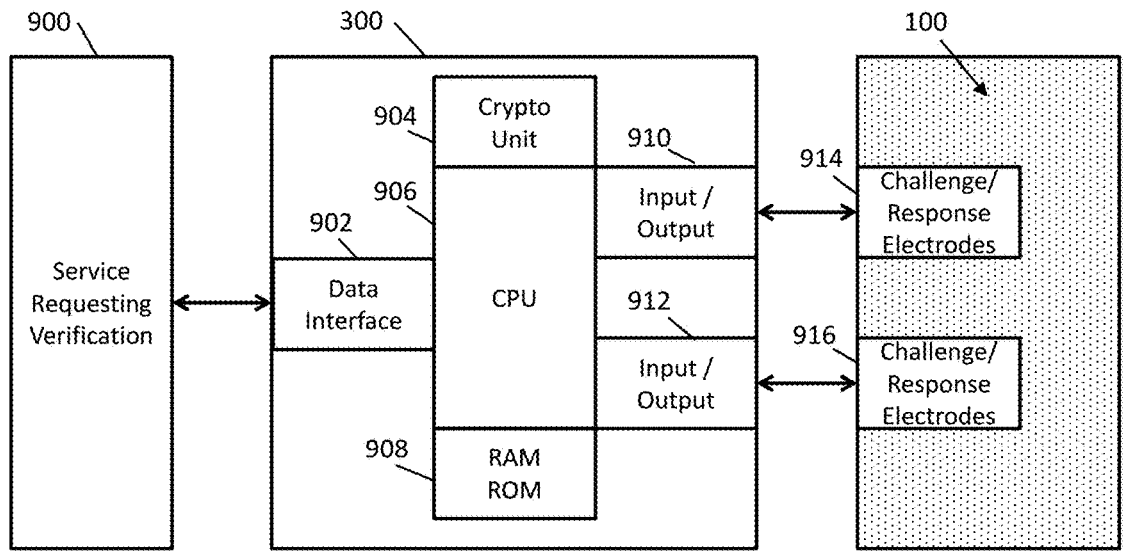
FIG. 9 shows an illustrative embodiment of a chip with an embedded biometric system.

FIG. 9 shows an illustrative embodiment of a chip with an embedded biometric system. The biometric system used to vent the IC-substrate assembly may be integrated into the IC 300 (chip) which forms part of said assembly, as shown in FIG. 9. The IC 300 may be a security controller chip, which comprises a data interface 902 for connecting the IC 300 to a service that requests verification of the assembly, a cryptographic unit 904, a central processing unit 906, a memory unit 908 (for example RAM and/or ROM), and input/output interfaces 910, 912. for connecting the IC 300 to challenge/response electrodes 914, 916 connected to the conductive glue 100. The input/output interfaces 910, 912 may be controlled by the central processing unit 906 of the IC 300. As mentioned above, the processing unit which is arranged to receive the measured capacitance values and compare them with reference values, may be comprised in the IC 300. This is useful because it may increase the level of security, in the sense that the risk that the processing unit is tampered with may be reduced, in particular in case the IC 300 is a security controller chip. Said processing unit may be the central processing unit 906 shown in FIG. 9, for example.

Figure 10:
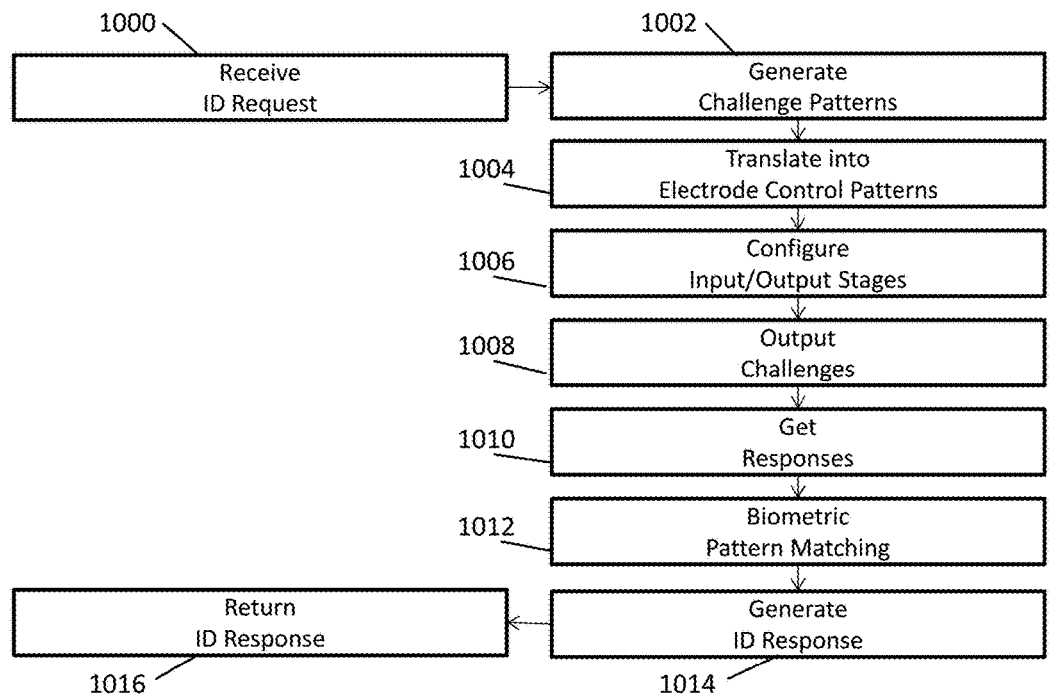
FIG. 10 shows an example of a verification sequence.

FIG. 10 shows an example of a verification sequence. The verification sequence comprises, at 1000, receiving an identification request, i.e. receiving a request to verily the identity of an IC-substrate assembly in accordance with the present disclosure. Furthermore, the verification sequence comprises, at 1002, generating challenge patterns, at 1004, translating the challenge patterns into electrode control patterns, at 1006, configuring input/output stages, at 1008, outputting challenges, at 1010, getting responses, at 1012, biometric pattern matching, at 1014, generating an identification response, at 1016, returning the identification response.

For the purpose of secure assembly authentication it may be desirable to produce reliable verifications with low False Acceptance Rates (FAR) and high False Reject Rates (FRR). The FAR may be easily controlled by adjusting the amount of challenges to be used to generate one response. The FRR may be scaled by proper definition of the different factors impacting the overall code entropy. Furthermore, when combined with a chip-related physical unclonable function, such as an SRAM-PUF, the resulting combination exhibits afar larger entropy than the SRAM-PUF applied alone.

It is noted that the embodiments above have been described with reference to different subject-matters. In particular, some embodiments may have been described with reference to method-type claims whereas other embodiments may have been described with reference to apparatus-type claims. However, a person skilled in the art will gather from the above that, unless otherwise indicated, in addition to any combination of features belonging to one type of subject-matter also any combination of features relating to different subject-matters, in particular a combination of features of the method-type claims and features of the apparatus-type claims, is considered to be disclosed with this document.

Furthermore, it is noted that the drawings are schematic. In different drawings, similar or identical elements are provided with the same reference signs. Furthermore, it is noted that in an effort to provide a concise description of the illustrative embodiments, implementation details which fall into the customary practice of the skilled person may not have been described. It should be appreciated that in the development of any such implementation, as in any engineering or design project, numerous implementation-specific decisions must be made in order to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill.

Finally, it is noted that the skilled person will be able to design many alternative embodiments without departing from the scope of the appended claims. In the claims, any reference sign placed between parentheses shall not be construed as limiting the claim, The word "comprise(s)" or "comprising" does not exclude the presence of elements or steps other than those listed in a claim. The word "a" or "an" preceding an element does not exclude the presence of a plurality of such elements. Measures recited in the claims may be implemented by means of hardware comprising several distinct elements and/or by means of a suitably programmed processor. In a device claim enumerating several means, several of these means may he embodied by one and the same item of hardware, The mere fact that certain measures are recited in mutually different dependent claims does not indicate that a combination of these measures cannot be used to advantage.

LIST OF REFERENCE SIGNS

100 conductive glue
102 conductive particles
200 contact pad
202 contact pad
300 chip
302 substrate
304 contact pad
306 contact pad
308 polyimide insulation layer
310 tinder-bump metallization
312 under-bump metallization
314 RDL metallization
316 RIM metallization
400 electrode
402 electrode 404 conductive particle
406 capacitor
408 conductive particle
410 contact pad
412 contact pad
500 measurement unit
502 general-purpose input/output pin
504 general-purpose input/output pin
506 general-purpose input/output pin
508 integration capacitor
510 parasitic capacitor
600 capacitive sensor
700 drive electrode control
702 receive electrode control
800 challenge code
802 challenge loop
804 stimulate challenge electrodes
806 physical unclonable function
808 sense receiving electrodes
810 assemble response code
812 pre-processing
814 feature extraction
816 template generator
818 reference templates
820 template matching
822 verification result
900 service requesting verification
902 data interface
904 cryptographic unit
906 central processing unit
908 memory unit
910 input/output interface
912 input/output interface
914 challenge/response electrodes
916 challenge/response electrodes
1000 receive identification request
1002 generate challenge patterns
1004 translate into electrode control patterns
1006 configure input/output stages
1008 output challenges
1010 get responses
1012 biometric pattern matching
1014 generate identification response
1016 return identification response

The invention claimed is:

1. An electronic device comprising:
a substrate;
an integrated circuit;
a layer of conductive glue between the substrate and the integrated circuit; and
a plurality of pairs of first electrodes and second electrodes connected to the conductive glue;
wherein each pair of first electrodes and second electrodes is arranged to receive a voltage generator input, such that a capacitance develops between each pair, wherein at least a part of said capacitance develops through the layer of conductive glue, wherein each pair is arranged to output said capacitance, wherein the voltage generator input of each pair is generated under control of a set of control signals, wherein the set of control signals represents a challenge code generated by a processing unit comprised in said device, and wherein the processing unit is further arranged to compare a plurality of measured capacitance values with a predetermined response code.

2. A device as claimed in claim 1, wherein the capacitance depends on the distribution of conductive particles in the layer of conductive glue.

3. A device as claimed in claim 2, wherein the distribution of conductive particles implements a physical unclonable function.

4. A device as claimed in claim 2, wherein the conductive particles each have a diameter in a range of 10 to 30 micrometers (μm).

5. A device as claimed in claim 1, further comprising:
a voltage generator being arranged to generate the voltage generator input;
a measurement unit being arranged to measure said capacitance and to output a corresponding capacitance value;
a processing unit which is arranged to receive at least one capacitance value from the measurement unit, and to compare said capacitance value with a reference value.

6. A device as claimed in claim 5, wherein the processing unit is further arranged to correct the capacitance value for environmental influences.

7. A device as claimed in claim 5, wherein the integrated circuit comprises at least one of: the processing unit, the first electrode, the second electrode, the voltage generator, the measurement unit.

8. A device as claimed in claim 1, wherein the integrated circuit is a general-purpose processor chip or an application processor chip.

9. A device as claimed in claim 1, wherein the substrate is a printed circuit board.

10. A device as claimed in claim 1, wherein the integrated circuit is a secure element, in particular a secure controller chip.

11. A device as claimed in claim 1, being a smart card.

12. A device as claimed in claim 1, wherein the integrated circuit further comprises contact pads connected to the conductive glue via an under-bump metallization layer.

13. A device as claimed in claim 1, wherein the integrated circuit is a secure element further comprising a cryptographic unit, the integrated circuit for use in a smartcard.

14. A method of manufacturing an electronic device, the method comprising providing the electronic device with:
a substrate;
an integrated circuit;
a layer of conductive glue between the substrate and the integrated circuit; and
a plurality of pairs of first electrodes and second electrodes connected to the conductive glue;
wherein each pair of first electrodes and second electrodes is arranged to receive a voltage generator input, such that a capacitance develops between each pair, wherein at least a part of said capacitance develops through the layer of conductive glue, wherein each pair is arranged to output said capacitance, wherein the voltage generator input of each pair is generated under control of a set of control signals, wherein the set of control signals represents a challenge code generated by a processing unit comprised in said device, and wherein the processing unit is further arranged to compare a plurality of measured capacitance values with a predetermined response code.

* * * * *